(12) United States Patent
Finn et al.

(10) Patent No.: US 6,288,443 B1
(45) Date of Patent: Sep. 11, 2001

(54) CHIP MODULE AND MANUFACTURE OF SAME

(76) Inventors: David Finn, Steigmuhlenweg 16 a, DE-87629 Fussen-Weissensee; Manfred Rietzler, Am Alsterberg 10, DE-87616 Marktoberdorf, both of (DE)

(*) Notice: Subject to any disclaimer, the term of this patent is extended or adjusted under 35 U.S.C. 154(b) by 0 days.

(21) Appl. No.: 09/319,393

(22) PCT Filed: Dec. 11, 1997

(86) PCT No.: PCT/DE97/02885

§ 371 Date: Jun. 2, 1999

§ 102(e) Date: Jun. 2, 1999

(87) PCT Pub. No.: WO98/26453

PCT Pub. Date: Jun. 18, 1998

(30) Foreign Application Priority Data

Dec. 11, 1996 (DE) .............................. 196 51 566

(51) Int. Cl.⁷ .......................... H01L 23/498; H01L 21/60
(52) U.S. Cl. ........................................ 257/678; 437/211
(58) Field of Search ................................ 257/678, 698, 257/692; 437/211

(56) References Cited

U.S. PATENT DOCUMENTS 6,002,170 * 12/1999 Kim et al. ............................ 257/698

FOREIGN PATENT DOCUMENTS

| 39 17 707 A1 | 12/1990 | (DE) . |
| 42 38 137 A1 | 5/1994 | (DE) . |

* cited by examiner

*Primary Examiner*—Don Wong
*Assistant Examiner*—James Clinger
(74) *Attorney, Agent, or Firm*—McGlew and Tuttle, P.C.

(57) ABSTRACT

A chip module (37) includes a substrate (12) and at least one chip (38) arranged on the substrate, wherein the chip 5 (11) is contacted via its terminal surfaces onto connecting leads (14, 15) of the substrate (12) and has a thickness d which is reduced compared to its original thickness D as a result of a removal of material on its rear side (39).

19 Claims, 3 Drawing Sheets

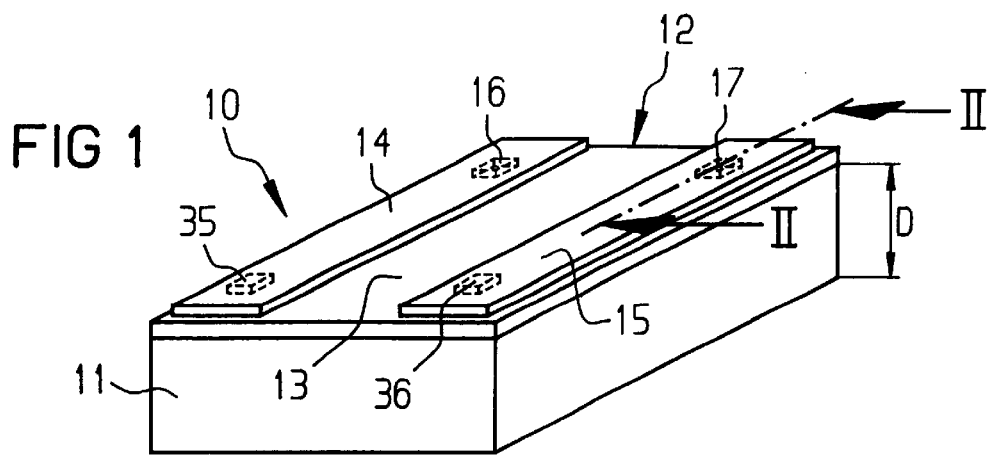
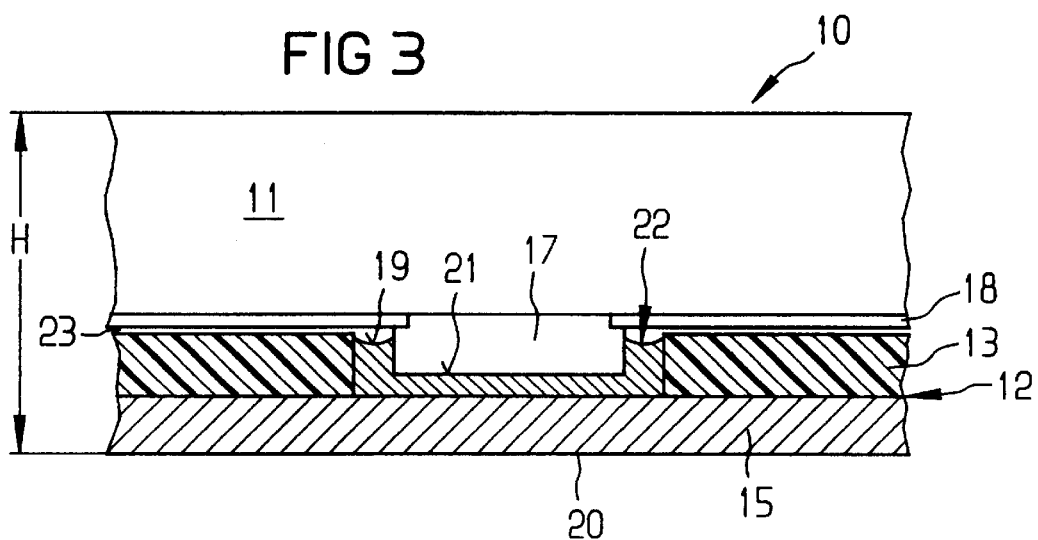
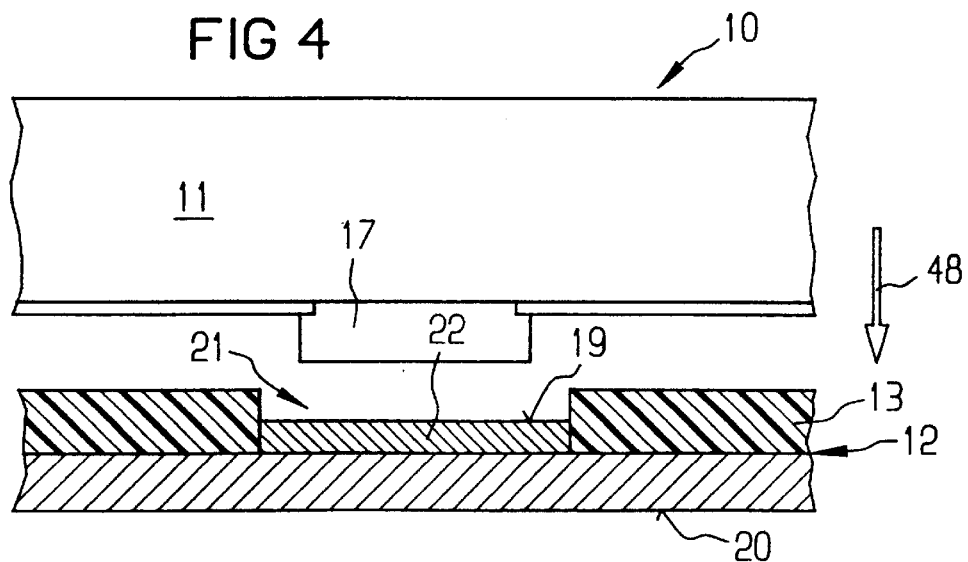

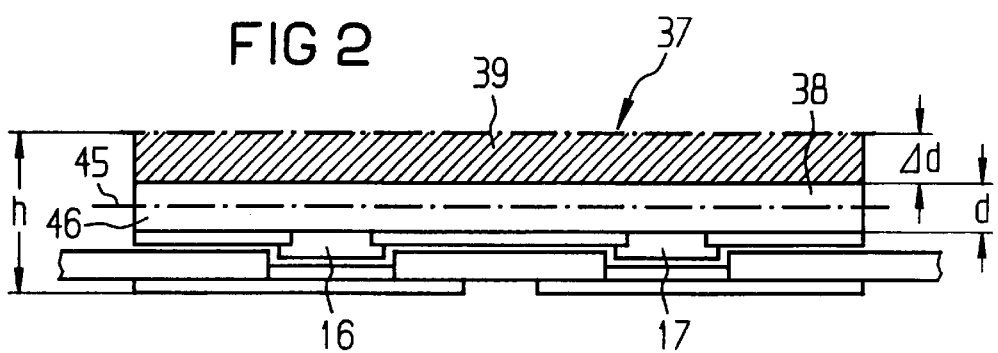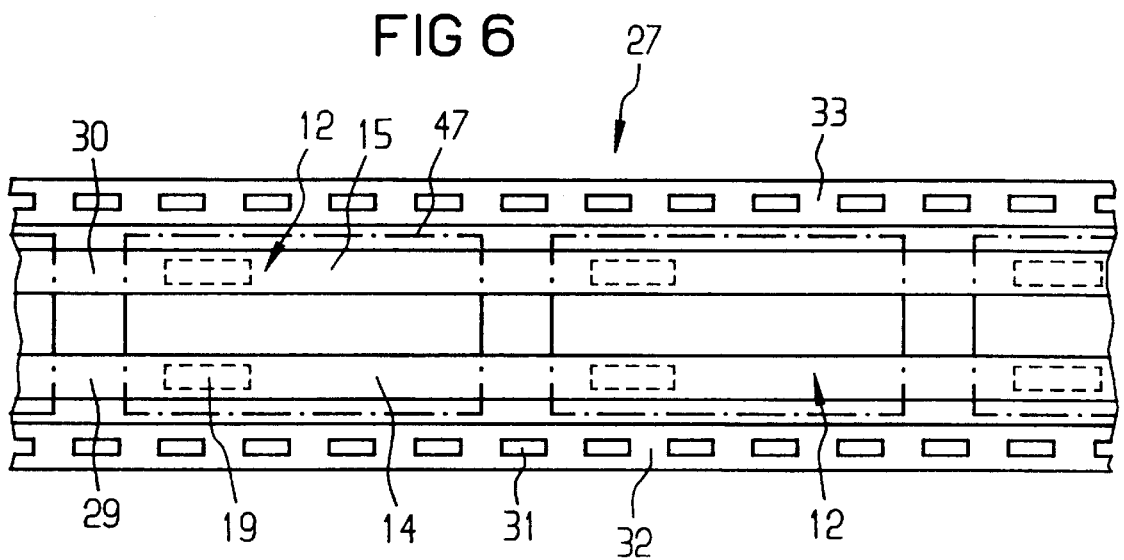

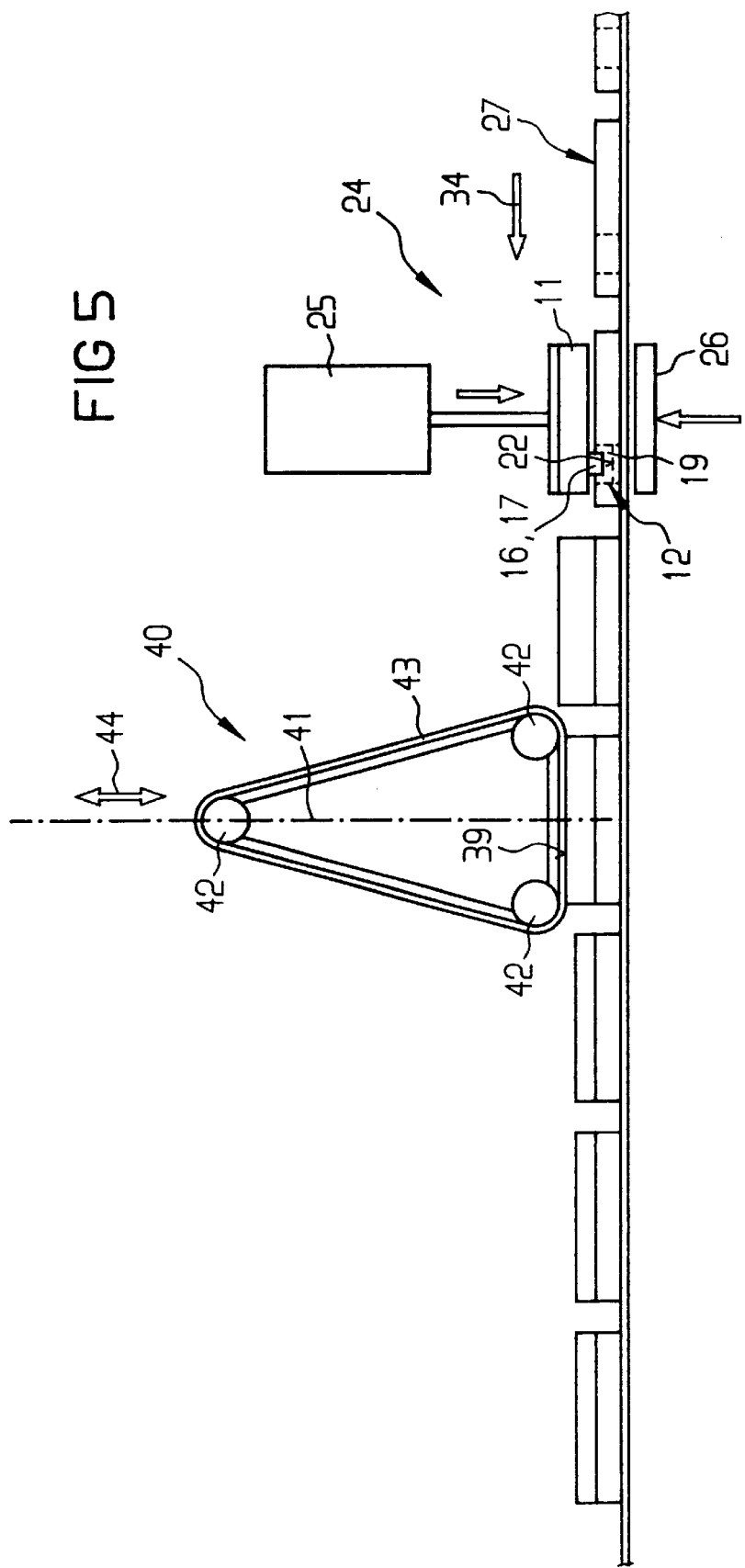

CHIP MODULE AND MANUFACTURE OF SAME

FIELD OF THE INVENTION

The present invention relates to a chip module with a substrate and at least one chip arranged on the substrate, wherein the chip is contacted via terminal surfaces arranged on its front side onto connecting leads of the substrate provided with a conductor path structure and the chip has a thickness which is reduced compared to its original thickness. The present invention further relates to a process for the production of a chip module with a substrate and at least one chip arranged on the substrate, wherein a handling unit with a chip and a substrate is formed by contacting the chip or chips onto the substrate provided with a conductor path structure in such manner that the chip or chips is/are contacted by its/their terminal surfaces onto connecting leads of the substrate, and wherein the processing of the chip or chips is effected by a material removal process on its or their rear side, the substrate providing for the handling and stabilization of the chip or chips during the processing.

BACKGROUND OF THE INVENTION

Chip modules comprising a chip arranged on a substrate are basically used in all cases in which simplified electric contacting of the chip is to be facilitated by means of substrate connecting leads which are substantially larger than the chip terminal surfaces. Thus such chip modules are used, for example, in chip cards and via the exposed substrate connecting leads extending over the card surface permit "external contacting" of the chip accommodated inside the chip card by the arrangement on the rear side of the substrate. Such chip modules are also used to construct so-called contactless chip cards in the case of which the substrate connecting leads provide for simplified contacting with an antenna coil arranged inside the card body. Naturally such chip modules can also be used, for example, to construct a so-called "combi-card" in the case of which external contacting for contact access to the card chip as well as internal contacting for contactless access to the chip via the antenna coil are facilitated by means of the substrate.

The combination of a chip with the substrate to form the chip module results in a composite structure, the thickness of which is relatively great compared to the thickness of the chip and the thickness of the substrate and which must be accommodated in a card body with defined outer dimensions. To ensure that the accommodation of a chip module in a card body imposes the least possible restrictions upon the possibilities of further component installations in the card body, it thus proves essential for the chip module to be designed to be as thin as possible.

A disadvantage of the known, relatively thick chip modules is that simply by virtue of their relative thickness, they have greater bending resistance compared to the flexible card body and therefore when the card body is subjected to bending stress as frequently occurs in everyday use, in particular when the substrate is arranged in the card surface as in the case of a contact card, the connection between chip module and card body can be stressed to a high level, leading to the detachment of the chip module from the card body. U.S. Pat. No. 5,155,068 has disclosed a chip module and process for the production of a chip module wherein the connection between chip and substrate is established in two consecutive process steps in which firstly the electric contacting of the bonding pads of the chip to terminal surfaces of the substrate is performed and then the mechanical connection between the chip and the chip substrate is effected by embedding the entire chip into a synthetic resin compound surrounding the chip. As a result of the embedding of the chip into the synthetic resin compound surrounding the chip, during the following abrasive processing of the rear side of the chip it is necessary to abrasively remove the material surrounding the chip in addition to the chip material.

JP-A-63 147 352, referred to in "Patent Abstracts of Japan", also discloses a process for the production of a chip module wherein the connection between chip and chip substrate is established in two process steps and wherein the chip is embedded in a synthetic resin compound for mechanical connection to the chip substrate.

EP-A-0 207 853 has disclosed a process wherein a plurality of chip modules are produced continuously using a film carrier.

SUMMARY AND OBJECTS OF THE INVENTION

The object of the present invention is to propose a chip module and a process for the production of a chip module facilitating the simplified establishment of a connection between a chip and a chip substrate and more effective processing of the chip to reduce the chip thickness.

The chip module according to the invention utilizes the fact that the electric circuit planes in the silicon body of the chip are adjacent to the front- or contact side of the chip provided with the terminal surfaces, and the region of the silicon body adjoining the surface of the rear side is free of electric circuit planes. It is thus possible, without impairing the function of the chip, to remove the surface of the chip from the rear side until a minimum thickness of the chip body ensuring satisfactory chip functioning is obtained, and in this way to make the chip substantially thinner.

The reduction in thickness of the chip not only facilitates a corresponding reduction in the overall thickness of the chip module but also enables the bending behavior of the chip module to be influenced. As a result of the reduction in the chip thickness, the bending behavior of the chip is adapted to the bending behavior of the substrate, thus leading to an overall more readily bending, more flexible chip module, the bending behavior of which resembles that of the card body.

In the chip module according to the invention, in order to achieve an interlocking contacting with bonding pads formed on the terminal surfaces, the chip projects into recesses of the substrate whose base is formed by the conductor path structure. The engagement of the bonding pads in the recesses of the substrate leads to a connection between chip and substrate with particularly good shearing strength. Furthermore, due to this "sunken" arrangement of the bonding pads in the substrate, a particularly planar design of the chip module is achieved simply by virtue of its configuration.

Here the bonding pads of the chip are embedded in an electrically conductive connecting material which is arranged in the recesses of the substrate and provides both for the electrical contacting of the chip and for the mechanical connection of the chip to the substrate. By means of this embedding of the bonding pads in the connecting material it is also easily possible to compensate for any tolerances occurring in the difference between the height of the bonding pads and the depth of the recesses through the connecting material and, while retaining a reliable, electrically conductive connection between the bonding pads of the chip and the connecting leads of the substrate, to provide the flattest possible overall arrangement of chip and substrate wherein the surface of the chip and the surface of the substrate can adjoin one another directly, thus without a gap. In the production of the chip module according to the invention it is thus also possible to omit the application of an underfiller known in the context of underfiller technology. The mechanically stabilizing effect of the underfiller which improves the shearing strength of the chip module can also be dispensed with since a particularly stable, mechanical load-bearing connection is provided by the "embedding" of the bonding pads and the associated covering of the bonding pads with the connecting material on all sides, at least in partial regions of the contact metallizations. The bonding pads can be formed from any electrically conductive material, such as for example an electrically conductive adhesive or a contact metallization made of solder material or the like.

The above described form of interlocking contacting between a chip and a substrate also has substantial advantages regardless of whether the contacted chip is a chip reduced in thickness by the removal of material or is a conventional chip, especially when a mechanically stable chip module is to be constructed.

To further increase the mechanical stability of the connection provided between chip and substrate in the chip module, at least one further projection which is electrically independent of the chip structure can be provided on the chip surface in addition to the bonding pads electrically conductively connected to the chip structure, said projection engaging into a fixing recess of the substrate. This projection, which can be designed and produced to be identical to the bonding pads forming electric terminals, provides a "contact dummy" which has merely a mechanically stabilizing function.

If desired, further mechanical stabilization or sealing can be provided by a peripheral or planar application of adhesive.

A particularly advantageous use of the chip module is in a chip card.

In the process according to the invention, the contacting of the chip or chips on the substrate is performed in such manner that bonding pads arranged on the terminal surfaces of the chip or chips are inserted into a connecting material arranged in recesses of the substrate. In this way a connection can be obtained which withstands even the highest levels of shearing stress, such as occur for example during the grinding processing of the rear side of the chip, as the connection established by the embedding of the bonding pads into the connecting material is additionally secured by the engagement of the bonding pads into the recesses of the substrate.

Prior to the contacting of the terminal surfaces, selective cleaning can take place of the chip terminal surfaces to be contacted and/or of the substrate contact surfaces or the bonding pads or connecting material surfaces optionally applied thereto.

The processing of the chip or chips can be performed using a grinding or lapping process. Another possible method of processing the chips to form a chip module of reduced thickness consists of performing a chemical etching process on the rear side of the chip.

The connecting material required to form the connection can differ in type and form. Thus, for example, prior to the insertion of the bonding pads into the recesses, the connecting material can be introduced into the recesses by planar application to the surface of the insulating layer and subsequent stripping off of the surface.

It is also possible to introduce the connecting material into the recesses in a liquid state, before or after the insertion of the bonding pads into the recesses, in a dosing process.

Another possible method of applying the connecting material consists of introducing the connecting material into the recesses in lump form, for example lead/tin solder spheres, prior to the insertion of the bonding pads.

The substrate used to produce the chip module can also have been pre-prepared inasmuch as the bonding pads are inserted into recesses already provided with a coating of connecting material in the region of the connecting leads. It is thus possible for the process according to the invention for the production of a chip module also to be performed on the basis of substrates appropriately pre-prepared by the substrate manufacturer, thereby facilitating a particularly cost-effective implementation of the process.

If the connection between the connecting material and the bonding pads and between the connecting material and the connecting leads takes place under the influence of pressure and heat, a connection between chip and substrate is ensured in which the adjacent surfaces of chip and substrate bear against one another whereby, when an appropriate quantity of connecting material is provided, an at least partial embedding of the bonding pads into the connecting material occurs, even in the case of a connecting material with high boundary surface tension.

The connection between the connecting material and the bonding pads can be implemented in accordance with the known flip-chip method in which the bonding pads of the chip are pressed against the connecting material under thermal influence. The heating of the connecting material necessary for the establishment of the connection thus takes place during the placement.

However, the connection can also be implemented such that only after the placement does the heating of the connecting material and the establishment of the connection take place in a so-called reflow process.

Irrespectively of the time at which the heat is introduced into the connecting material, it has proved particularly advantageous for the introduction of the heat into the connecting material to take place via the connecting leads of the substrate. In this way the chip remains substantially free of thermal stress during the establishment of the connection.

It is also advantageous if a function test of the chip is performed following the processing of the chip. Here the connecting leads of the substrate form the test contacts. The implementation of this electric test, generally a continuity test, facilitates the detection of a chip module which has been functionally impaired, possibly due to the processing of the chip or due to the formation of the connection between chip and substrate.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 1 is a perspective view of a chip module comprising a chip and a substrate arranged thereon;

FIG. 2 is an enlarged side view of the chip module illustrated in FIG. 1;

FIG. 3 is an enlarged partial view of the chip module according to FIG. 2;

FIG. 4 is a view corresponding to FIG. 3 directly prior to the connection of the chip to the substrate to form the chip module;

FIG. 5 is a schematic diagram of a device for the continuous production of the chip module shown in FIG. 1; and FIG. 6 is a partial view of a substrate strip with individual substrates.

DESCRIPTION OF THE PREFERRED EMBODIMENT

Referring to the drawings in particular, FIG. 1 illustrates a chip module 10 comprising a chip 11 and a contacting substrate 12. On the upper side of the chip module, facing away from the chip 11 an insulating layer is provided in the form of a carrier layer 13. On the upper side of carrier layer 13 the substrate 12 comprises connecting leads 14, 15 which in the example shown here are provided in duplicate. The leads 14 and 15 extend upon and substantially longitudinally over the carrier layer 13.

In the exemplary embodiment shown in FIG. 1, the chip 11 comprises two raised contact metallizations 16, 17. These metallizations are referred to in the literature of the art as "bumps". These bumps penetrate through and project from a passivation layer 18 (FIG. 3) of the chip 11 not shown in detail in FIG. 1.

Although FIG. 1 illustrates a chip 11 provided only with two contact metallizations 16, 17, as used for example in a chip card (not shown in detail here), it is to be emphasized that the following detailed description applies equally to chips having a different number of contact metallizations, in particular those having a plurality of contact metallizations, in which case the substrate to be connected to such a chip is designed correspondingly with a larger number of connecting leads. The design shown in FIG. 1 presents a particularly clear representation.

In the case of the chip module 10 shown in FIG. 1, the chip 11 contacted onto the substrate 12 has a regular thickness D which substantially corresponds to the thickness of a wafer, not shown in detail here, from which the chip 11 has been formed by separation from the wafer composite. As will be explained further in the following, the configuration of the chip module 10 shown in FIG. 1 forms a handling unit as basis of the production of a chip module 37, illustrated by way of example in FIG. 2, comprising the chip 38 of reduced thickness. As is to be indicated by the shaded subsidiary area in FIG. 2, following the material-removing processing of a surface arranged opposite the contact metallizations 16, 17 and referred to in the following as rear side 39, the chip 38 is to possess a thickness reduced by Δd compared to the chip 11 shown in FIG. 1, so that the thickness d of the chip 38 is substantially smaller than the thickness D of the chip 11 (FIG. 1).

If FIG. 2 is compared with FIG. 3, which illustrates an enlarged partial view of the chip module 10, it will be apparent that the thickness reduction Δd shown -in FIG. 2 results in a chip module 37 with a substantially smaller overall thickness h compared to the chip module 10 with the overall thickness H.

In the form of the example of a connection point, FIGS. 3 and 4 illustrate the manner in which the connection between the contact metallization 17 and the connecting lead 15 of the substrate 12 is established to form the chip module 10. It can clearly be seen how, commencing from a covering layer with associated recess 19, the contact metallization 17 engages into the recess 19 formed in the carrier layer 13 in the region of the contact metallization 17. The recess 19 in the carrier layer 13 extends up to the connecting lead 15 arranged on the rear side of the carrier layer 13 facing towards the chip 11 and leaves said connecting lead 15 exposed in the region of a rear chip contact zone 21 arranged opposite an outer contact side 20.

The recess 19 contains a connecting material 22 which serves both to establish an electrically conductive connection between the contact metallization 17 and the chip contact region 21 of the connecting lead 15 and to establish a mechanically reliable connection between the chip 11 and the substrate 12.

The connecting material 22 illustrated in FIGS. 3 and 4 consists of a solder coating in solid form applied to the chip contact region 21 of the connecting lead 15. The solder composition selected for the solder coating here is adapted to the alloy or material composition used for the contact metallization 17. When gold is used for the contact metallization 17, a lead/tin solder is suitable as connecting material. In place of the solder coating it is also possible, for example, to use an electrically conductive epoxide-resin-based adhesive or a thermoplastic adhesive.

In any case, regardless of the nature of the connecting material, the connection illustrated in FIG. 3 between the contact metallization 17 and the chip contact region 21 of the connecting lead 15 is established by the introduction (arrow 48 in FIG. 4) of the contact metallization 17 into the recess 19, commencing with the chip 11 arranged above the substrate 12 (FIG. 4), with the displacement of the connecting material 22. In order, in the case of a connection established in this way, to ensure a repeatable, uniform and smallest possible overall height H of the chip module 10 formed by the chip 11 and substrate 12, it is sufficient to introduce the contact metallization 17 into the recess 19 until the passivation layer 18 of the chip 11 bears against the surface of the carrier layer 13 facing towards the chip 11. To further improve the mechanical connection between the chip 11 and substrate 12 effected via the connecting material 22 and illustrated in FIG. 1 in the case of the example of the contact metallization 17, as indicated in FIG. 1 it is possible to provide further metallization projections 35, 36 in addition to the contact metallizations 16, 17 serving for the electrical contacting of the substrate 12, which further projections 35, 36 are formed similarly to the contact metallizations 16, 17 and are inserted into fixing recesses which correspond in form to the recesses 19 but have not been shown in detail here. Here again, precisely as in the case of the contact metallizations 16, 17, a connection is established between the metallization projections 35, 36 and the connecting leads 14, 15, although this connection serves merely for the mechanical fixing of the chip on the substrate and does not have any electrical contact function. To assist the adhesion of the chip 11 on the substrate 12, planar or peripheral adhesion of the chip 11 on the substrate 12 can also be provided.

As can be clearly seen from FIG. 3, even in the case of the only partial recessing of the contact metallization 17 into the connecting material 22, wetting occurs of all the exposed sides of the contact metallization 17, here shown in simplified form as a parallelepiped. This leads to correspondingly small electrical resistances in the contact region of the contact metallization 17 and the connecting material 22 and to good mechanical adhesion.

In order to prevent the formation of pressure cushions due to compression effects in the recess 19, especially when the recess 19 is plentifully filled with connecting material 22, on its upper side facing towards the chip the carrier layer 13 of the substrate 12 can be provided with a groove-like ventilating channel 23 leading outwards from the recess 19 or with other suitable devices.

In addition to the insulating layer formed as carrier layer 13 and illustrated in FIG. 1, a further insulating layer, which covers the connecting leads at least except for contact recesses, can also be arranged on said connecting leads. Additionally, the chip module 10 can also be provided with a coil arranged on the substrate to form a transponder.

The softening of the connecting material or melting of the connecting material required for the recessing of the contact metallization 17 into the connecting material 22 can take place simultaneously to the application of the pressure required for the displacement of the connecting material, as illustrated for example in FIG. 5. FIG. 5 shows a chip module production device 24 with two components combined in a stationary device, namely a chip placement device 25 and a heating device 26. As can be seen from FIG. 5, the chip 11 is moved from above, with its contact metallizations 16, 17 facing downwards, towards the substrate 12 here arranged in a substrate strip 27. The contact metallizations 16, 17 are now brought to bear against the connecting material 22 arranged in the recesses 19 in the chip contact region 21 (FIG. 3) of the connecting leads 14, 15. During the contacting of the contact metallizations 16, 17 with the connecting material 22, contact heating of the connecting leads 14, 15 can be effected by means of the heating device 26, which is moved from below the substrate strip 27 towards the particular substrate 12. Under the pressure of the chip placement device 25, the contact metallizations 16, 17 then penetrate into the connecting material 22 softening under the effect of the heat.

As an alternative to heating the connecting material 22 during the placement of the chip 11 as described in the foregoing, it is also possible to melt the connecting material 22 in a reflow process following the placement of the chip 11, and thus to effect the wetting of the contact metallizations required for the connection of the connecting material 22 to the contact metallizations 16, 17. Depending upon the nature of the connecting material, here it can be necessary to overcome the boundary surface resistance of the connecting material 22 by applying pressure to the contact metallizations 16, 17 using an additional pressure device downstream of the chip placement device 25, in order to facilitate the recessing of the contact metallizations 16, 17 into the connecting material 22 so as to achieve the described embedding of the contact metallizations 16, 17 in the connecting material 22.

FIG. 6 is a plan view of the substrate strip 27 already mentioned in association with the chip module production device 24 illustrated in FIG. 5. As can be seen from the plan view, the substrate strip 27 comprises a plurality of continuously, consecutively formed substrates 12 connected to one another via their connecting leads 14, 15 extending over the substrates. In order to separate an individual substrate 11, as shown in FIG. 1, from the substrate strip 27 it is only necessary to perform a punching process along the punching lines 47 represented in dash-dotted manner in FIG. 6. The punching process serves to sever connecting regions 29, 30 of the connecting leads 14, 15 and outer edges 32, 33 of the substrate strip 27 which form traction edges and are provided with a perforation 31. Such a design of the substrate strip 27 facilitates the continuous production of chip modules 10 wherein, as illustrated in FIG. 5, the substrate strip 27 with the substrates 12 provided therein is conducted past the chip placement device 25 in the feed direction 34 in clock controlled manner.

The chip modules 10 produced in the chip module production device 24 in each case constitute an intermediate product or handling unit for the subsequent processing of the chips 11 with the goal of producing chip modules 37 comprising chips 38 which are thinner than the chips 11. By virtue of the composite formed by the substrate strip, the chip modules 10 in their totality form a corresponding handling composite. Prior to the separation of the chip modules 10 from the substrate strip 27 explained in the foregoing, as illustrated in FIG. 5 in the example of a continuous production process, material-removing processing of the chips 11 of the chip modules 10 takes place following their production in the chip module production device 24. For this purpose the chip modules 10 are fed to a processing device 40 in which chip body material is removed from the rear side 39 of the chip 11, as schematically illustrated in FIG. 2. In the processing operation illustrated by way of example in FIG. 5, the processing device consists of a belt grinding device 40 comprising an endless grinding belt 43 continuously revolving via rollers 42 on a device carrier 41. The device carrier 41 is provided with an adjusting device, not shown in detail here, which enables the device carrier 41 to be moved upwards and downwards in the direction of the double arrow 44. By superimposing an adjusting movement, directed towards the rear side 39 of the chip 11, upon the revolving movement of the grinding belt 43, the chip 11 can be continuously reduced in its thickness until a chip 38 is obtained having a thickness d reduced compared to that of the original chip 11 (FIG. 2).

The thickness d attainable by means of this processing is limited by the boundary layer 45, indicated in dashdotted lines in FIG. 2, which delimits a circuit region 46 of the chip situated between the passivation layer 18 and the boundary layer 45. Until the boundary layer 45 is reached, the chip can be processed from its rear side 39 without impairing the function of the chip due to penetration into the circuit region 46.

The processing of the chip 11 with the belt grinding device 40 as illustrated in FIG. 5 gives rise to the chip module 37 illustrated in FIG. 2, which has a substantially reduced overall height h compared to the starting chip module 10. The chip modules 37 of reduced thickness continuously produced in accordance with the process illustrated in FIG. 5 can then be separated from the composite substrate strip 27 as described in the foregoing with reference to FIG. 6.

While specific embodiments of the invention have been shown and described in detail to illustrate the application of the principles of the invention, it will be understood that the invention may be embodied otherwise without departing from such principles.

What is claimed is:

1. A chip module comprising:
    a substrate with connecting leads and recesses;
    a chip arranged on said substrate, said chip having terminal surfaces arranged on a chip front side and being contacted via said terminal surfaces onto connecting leads of the substrate provided with a conductor path structure, said chip having a thickness which is reduced compared to an initial thickness of a wafer from which said chip has been formed;
    bonding pads formed on said terminal surfaces, said chip projecting with said bonding pads into said recesses of the substrate, the base of said recesses being formed by said connecting leads of said conductor path structure and said bonding pads being embedded in a connecting material which is arranged in said recesses of said substrate, said connecting material defining an electrical contact of said chip and providing a mechanical connection of said chip to said substrate.

2. A chip module according to claim 1, further comprising: at least one further projection, in addition to the bonding pads, which are electrically conductively connected to the conductor path structure and engage into the recesses, said further projection being electrically independent of said conductor path structure and being provided on a front side of said chip, said projection engaging into a fixing recess of said substrate.

3. A chip module according to claim 1, wherein in said chip is adhesively connected to said substrate in a peripheral or planar manner.

4. A chip module according to claim 2, wherein in said chip is adhesively connected to said substrate in a peripheral or planar manner.

5. A chip module according to claim 1 wherein said chip forms part of a chip card.

6. A chip module according to claim 2 wherein said chip forms part of a chip card.

7. A chip module according to claim 3 wherein said chip forms part of a chip card.

8. A chip module comprising:

a substrate with connecting leads and recesses;

a chip arranged on said substrate, said chip having terminal surfaces arranged on a chip front side and being contacted via said terminal surfaces onto connecting leads of the substrate provided with a conductor path structure;

bonding pads formed on said terminal surfaces, said chip projecting into said recesses of the substrate whose base is formed by said connecting leads of said conductor path structure and said bonding pads being embedded in a connecting material which is arranged in a recesses of said substrate, said connecting material defining an electrical contact of said chip and providing a mechanical connection of said chip to said substrate;

at least one further projection, in addition to the bonding pads, which are electrically conductively connected to the conductor path structure and engage into the recesses, said further projection being electrically independent of said conductor path structure and being provided on a front side of said chip, said projection engaging into a fixing recess of said substrate.

9. A chip module comprising:

a substrate defining a plurality of recesses and including a plurality of connecting leads forming a base of said plurality of recesses;

a chip including an electrical circuit region and a plurality of terminal surfaces electrically connected to said circuit region, said terminal surfaces including bonding pads, said chip module being arranged on said substrate with said plurality of bonding pads arranged in said plurality of recesses;

a connecting material in said plurality of recesses and in contact with said connecting leads and said bonding pads, said connecting material forming an electrical connection between said connecting leads, said bonding pads and said terminal surfaces, said connecting material also forming a mechanical connection between said chip and said substrate.

10. A chip module in accordance with claim 9, wherein:

said connecting material and said mechanical connection is only between said recesses and said bonding pads.

11. A chip module in accordance with claim 9, wherein:

said chip is only held to said substrate by said mechanical connection.

12. A chip module in accordance with claim 10, wherein:

said chip is only held to said substrate by said mechanical connection.

13. A chip module in accordance with claim 9, wherein:

said chip has a bonding surface from which said bonding pads extend;

said substrate has a recess side surface defining openings of said recesses and in contact with said bonding surface of said chip, said recess side surface extends further than said bonding surface.

14. A chip module in accordance with claim 13, wherein:

said bonding surface and said recess side surface are substantially planar.

15. A chip module in accordance with claim 9, wherein:

said chip has a bonding surface from which said bonding pads extend;

said substrate has a recess side surface defining openings of said recesses and in contact with said bonding surface of said chip, said recess side surface and said bonding surface being substantially equal to an overall planar area of the chip module.

16. A chip module in accordance with claim 9, wherein:

an overall planar size of said chip and said substrate are substantially equal in size.

17. A chip module in accordance with claim 9, wherein:

said substrate has a recess side surface defining openings of said recesses;

said chip has a bonding surface from which said bonding pads extend, said bonding surface being in contact with said bonding surface of said chip, said chip having a base surface opposite said bonding surface, said base surface being spaced from said substrate.

18. A chip module in accordance with claim 17, wherein:

said base surface is spaced from all outmost surfaces of said substrate in a direction substantially perpendicular to said base surface.

19. A chip module according to claim 9, further comprising:

a non-terminal bonding pad arranged in one of said recesses with said connecting material, said non-terminal bonding pad being electrically independent of said circuit region in said chip, said non-terminal bonding pad, said connecting material and said substrate forming only a mechanical connection between said substrate and said chip.

* * * * *